(12) United States Patent
Onohara

(10) Patent No.: US 12,200,859 B2
(45) Date of Patent: Jan. 14, 2025

(54) CIRCUIT BOARD

(71) Applicant: TOPPAN INC., Tokyo (JP)

(72) Inventor: Jun Onohara, Tokyo (JP)

(73) Assignee: TOPPAN INC., Tokyo (JP)

( * ) Notice: Subject to any disclaimer, the term of this patent is extended or adjusted under 35 U.S.C. 154(b) by 184 days.

(21) Appl. No.: 17/860,438

(22) Filed: Jul. 8, 2022

(65) Prior Publication Data
US 2022/0346226 A1 Oct. 27, 2022

Related U.S. Application Data

(63) Continuation of application No. PCT/JP2021/000204, filed on Jan. 6, 2021.

(51) Int. Cl.
*H05K 1/02* (2006.01)
*H05K 1/03* (2006.01)
*H05K 1/16* (2006.01)

(52) U.S. Cl.
CPC ......... *H05K 1/0306* (2013.01); *H05K 1/0243* (2013.01); *H05K 1/0298* (2013.01); *H05K 1/162* (2013.01); *H05K 1/165* (2013.01); *H05K 2201/09545* (2013.01)

(58) Field of Classification Search
CPC .............. H01L 23/15; H01L 23/49822; H03H 2001/0085; H03H 3/00; H03H 7/0115; H03H 7/1775; H05K 1/0233; H05K 1/0243; H05K 1/0298; H05K 1/0306;
(Continued)

(56) References Cited

U.S. PATENT DOCUMENTS

2014/0085846 A1 3/2014 Ma et al.
2017/0187345 A1* 6/2017 Yun ................... H03H 7/463
(Continued)

FOREIGN PATENT DOCUMENTS

| JP | 08-330730 A | 12/1996 |
|---|---|---|
| JP | 2011-134957 A | 7/2011 |
| JP | 2017-163027 A | 9/2017 |

(Continued)

OTHER PUBLICATIONS

Extended European Search Report issued in connection with; EP Appl. Ser. No. 21738039.3 dated Jul. 13, 2023.
(Continued)

*Primary Examiner* — Timothy J Thompson
*Assistant Examiner* — Guillermo J Egoavil
(74) *Attorney, Agent, or Firm* — Foley & Lardner LLP

(57) ABSTRACT

A circuit board having excellent reliability of connection between layers while being capable of achieving a compact and low-profile electronic device. In the circuit board has an LC circuit built therein with the use of a glass core having a through hole, a conductor layer formed in the through hole is connected to a wiring pattern formed on one surface of the glass core, and connected to a wiring pattern formed on the other surface of the glass core, with the conduction layer projected from the surface of the glass core. Thus, the area of contact between the conduction layer and the through hole is increased, thus making it possible to prevent the reliability of connection between layers in the through hole from being decreased, even when the glass core is reduced in thickness for achieving a low-profile device.

11 Claims, 9 Drawing Sheets

(58) Field of Classification Search
CPC .......... H05K 1/162; H05K 1/165; H05K 1/02; H05K 1/03; H05K 1/16; H05K 2201/09545
USPC ........................................................ 174/258
See application file for complete search history.

(56) References Cited

U.S. PATENT DOCUMENTS

| | | |
|---|---|---|
| 2017/0263545 A1 | 9/2017 | Tsukamoto et al. |
| 2020/0275558 A1 | 8/2020 | Fujita |

FOREIGN PATENT DOCUMENTS

| | | | | |
|---|---|---|---|---|
| JP | 2019-106429 A | 6/2019 | | |
| WO | WO-2019117073 A1 * | 6/2019 | ......... | H01F 17/0013 |

OTHER PUBLICATIONS

International Search Report with English Translation and Written Opinion in International Application No. PCT/JP/2021/000204 mailed Mar. 30, 2021.

* cited by examiner

CIRCUIT BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2021/000204, filed on Jan. 6, 2021, which in turn claims the benefit of JP 2020-002788, filed Jan. 10, 2020 the disclosures of all which are incorporated herein by reference in its entirety.

TECHNICAL FIELD

The present invention relates to a circuit board.

BACKGROUND

Wireless communications systems that enable the rapid spread of smartphones are supported by the increased functions of RF front end modules (RFFM: Radio Frequency Front end Module). An RFFM is composed of a filter power amplifier (PA: Power Amplifier), a low noise amplifier (LNA: Low Noise Amplifier), and an RF switch. As the integration of components advances, the circuits become increasingly complicated, and the number of components also tends to increase.

In particular, as the RFFM becomes smaller, thinner, and more multifunctional, the number of components to be mounted in the RFFM increases, and accordingly the demand for lower-profile multilayer wiring substrates of RFFM packages increases. As one of methods for easily achieving such lower-profile semiconductor packages, a method of using a thin multilayer wiring substrate is known.

For example, attempts have been made to provide a lower-profile RFFM overall by reducing the thickness of an insulating resin layer of a thin multilayer wiring substrate.

In contrast, wiring substrates for mounting electronic components such as a semiconductor chip have been proposed in various shapes and structures. For example, PTL 1 discloses a wiring substrate that has a structure where an insulating resin layer is formed on both upper and lower sides of an inner wiring layer of the wiring substrate, and a conductor provided in a via formed in the insulating resin layer is connected to a land of the inner wiring layer.

This technique can provide a multilayer wiring substrate that can improve the wiring density of the inner wiring layer while having the minimum land area while ensuring the reliability of connection between the inner wiring layer and the land. No consideration is, however, made at all for achieving lower-profile multilayer wiring substrates.

Accordingly, there has been a need for a technique that can improve the wiring density of the inner wiring layer while having the minimum land area and that can achieve a lower-profile substrate, while ensuring the reliability of connection between the inner wiring layer and the land.

[Citation List] [Patent Literature] [PTL 1] JP 2011-134957 A

SUMMARY OF THE INVENTION

The present invention is achieved in view of such circumstances, and an object of the present invention is to provide a circuit board that is capable of achieving a compact and low-profile electronic device and excellent in reliability of connection between layers.

According to an aspect of the present invention, there is provided a circuit board that has an LC circuit built therein by using a glass core having a through hole, the circuit board including:
a basic circuit board with the LC circuit formed thereon; and buildup layers formed on the front and rear surfaces of the basic circuit board, where
the basic circuit board includes:
wiring patterns formed on the front and rear surfaces of the glass core;
a conduction layer formed in the through hole of the glass core, the conduction layer connecting the wiring patterns on the front and rear surfaces of the glass core; and
the LC circuit comprising a capacitor and an inductor, the capacitor including a first electrode, a dielectric layer formed thereon, and a second electrode formed on the dielectric layer, the first electrode being at least one of the wiring patterns formed on the front and rear surfaces of the glass core, the inductor including a solenoid coil where one of the wiring patterns formed on one surface of the glass core and other one of the wiring patterns formed on an other surface of the glass core are sequentially connected in series via the conduction layer formed in the through hole, where
the conductor layer is connected to the one of the wiring patterns formed on the one surface of the glass core and projected from the other surface of the glass core, and the conduction layer which is projected is connected to the other one of the wiring patterns formed on the other surface of the glass core, and where
insulating resin layers are formed on the front and rear surfaces of the basic circuit board which includes the wiring patterns, the conduction layer, and the LC circuit, and the wiring patterns formed on the insulating resin layers are connected to the electrodes of the capacitor and the wiring patterns formed on the glass core via through holes formed in the insulating resin layers.

According to another aspect of the present invention, there is provided a circuit board according to the aspect mentioned above, where the conduction layer is a laminate of a seed layer and a metal layer, the seed layer having strong adhesion to a base.

According to still another aspect of the present invention, there is provided a circuit board according to the aspect mentioned above, where the seed layer is a laminate of a thin film of copper and a thin film selected from Ti, Cr, Ni, and Al.

According to still another aspect of the present invention, there is provided a circuit board including:
a glass core provided with a first main surface and a second main surface, the glass core being provided with one or more through holes each extending from the first main surface to the second main surface;
a conduction layer including one or more first parts coating each side wall of the one or more through holes, and one or more second parts each projected from the second main surface at positions of the one or more through holes;
a first wiring pattern provided on the first main surface and electrically connected to the conduction layer; and
a second wiring pattern provided on the second main surface, the second wiring pattern coating the one or more second parts.

According to still another aspect of the present invention, there is provided a circuit board according to the aspect mentioned above, where the one or more second parts have a tapered shape.

According to still another aspect of the present invention, there is provided a circuit board according to any of the aspects mentioned above, where the glass core has a thickness in the range of 50 to 1000 μm.

According to still another aspect of the present invention, there is provided a circuit board according to any of the aspects mentioned above, where the one or more second parts are projected from the second main surface at a height within the range of 1 to 10 μm from the second main surface.

According to still another aspect of the present invention, there is provided a circuit board according to any of the aspects mentioned above, where the conduction layer includes: a first layer containing one or more elements selected from the group consisting of Ti, Cr, Ni, and Al; and a second layer containing copper, provided on the first layer.

According to still another aspect of the present invention, there is provided a circuit board according to any of the aspects mentioned above, the circuit board further including:
a dielectric layer provided on the first wiring pattern; and
an electrode provided on the dielectric layer, where
the electrode, the dielectric layer, and a part of the first wiring pattern facing the electrode with the dielectric layer interposed therebetween constitute a capacitor.

According to still another aspect of the present invention, there is provided a circuit board according to any of the aspects mentioned above, where at least a part of the first wiring pattern, at least a part of the conduction layer, and at least a part of the second wiring pattern constitute a solenoid coil having a screw axis in a direction intersecting the thickness direction of the glass core.

According to still another aspect of the present invention, there is provided a circuit board according to any of the aspects mentioned above, where
one or more first buildup layers provided over the first main surface with the first wiring pattern interposed therebetween, the one or more first buildup layers each including a first insulating resin layer and a third wiring pattern provided on the first insulating resin layer; and
one or more second buildup layers provided over the second main surface with the second wiring pattern interposed therebetween, the one or more second buildup layers each including a second insulating resin layer and the third wiring pattern provided on the second insulating resin layer.

According to still another aspect of the present invention, there is provided a packaged component including:
the circuit board according to any of the aspects mentioned above; and
one or more components mounted on the circuit board.

According to still another aspect of the present invention, there is provided a packaged component according to the aspect mentioned above, where the one or more components include a high-frequency component.

In the circuit board according to the present invention, the conductor layer formed in the through hole of the glass core having the through hole is connected to the wiring pattern formed on one surface of the glass core, and formed through the through hole and beyond the thickness of the glass core to be projected from the other surface of the glass core. The projected part is connected to the wiring pattern formed on the other surface of the glass core, thus increasing the length of the conduction layer formed in the through hole and formed to extend from the through hole, and then increasing the area of contact between the through hole and the conduction layer. Thus, the interlayer connection reliability can be prevented from being decreased, even when the circuit board becomes thinner due to the lower-profile electronic devices.

DETAILED DESCRIPTION

Figure 1:
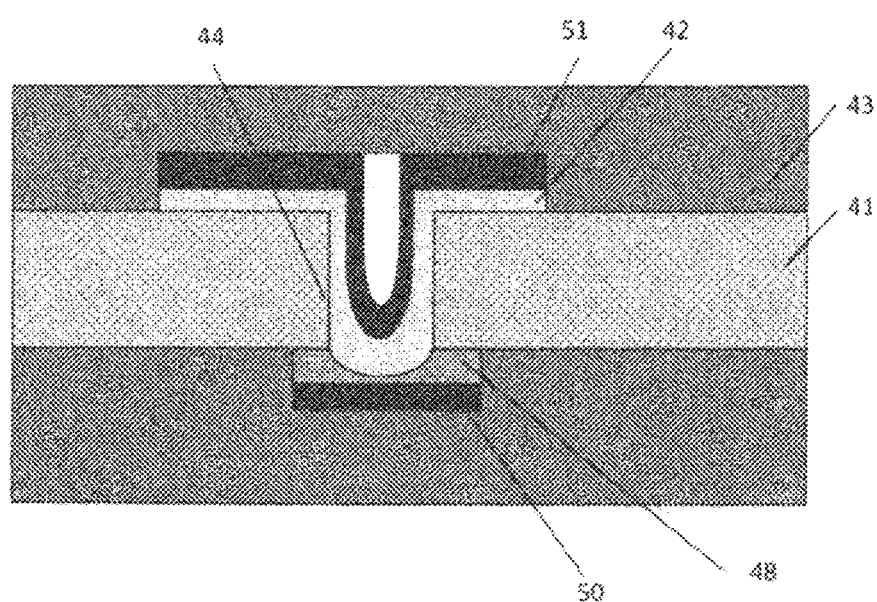
FIG. 1 is a cross-sectional view schematically illustrating a structure capable of improving interlayer connection reliability in a circuit board according to the present invention.

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

<Circuit Board>

With reference to the drawings, an embodiment of a circuit board according to the present invention will be described below. In the specification, the term "upper" refers to a position farther from a glass plate, and the term "lower" refers to a position closer to a glass plate.

In addition, the term "circuit elements" refers to passive elements such as resistors, capacitors, inductors, reactors, and further refers to components of an LC circuit. These circuit elements are used as components of an LC filter that constitutes a bandpass filter for use in time division duplex transmission/reception communication at frequency bands of 2 GHz or higher in multi-band communication. Such an LC filter may be a demultiplexing filter such as a low-pass filter, a high-pass filter, or a diplexer, or may be a notch filter that removes noise in a specific band.

In a circuit board having such a function, a bandpass filter for use in time division duplex (TDD) at frequency bands of 2 GHz or higher in the multi-band communication can be constituted by an LC filter. The reactance element of such an LC filter can contribute to the low-profile circuit board by having at least a part of the structure in the circuit board. In addition, RF (Radio Frequency) components other than the LC filter are mounted on the circuit board, thereby allowing a more compact circuit board to be achieved.

According to an embodiment of the present invention, built-in circuit elements in the circuit board allow the region located above the built-in circuit elements in the circuit board surface to be used for mounting other components, thereby allowing a highly functional and compact circuit board to be achieved.

Next, an example of a capacitor and an inductor as circuit elements forming an LC circuit will be described by using an example of a substrate in which a wiring layer and an insulating resin layer are formed on each side of a core material made of a glass plate.

The capacitor has a structure in which a dielectric is sandwiched between two electrodes.

Figure 2:
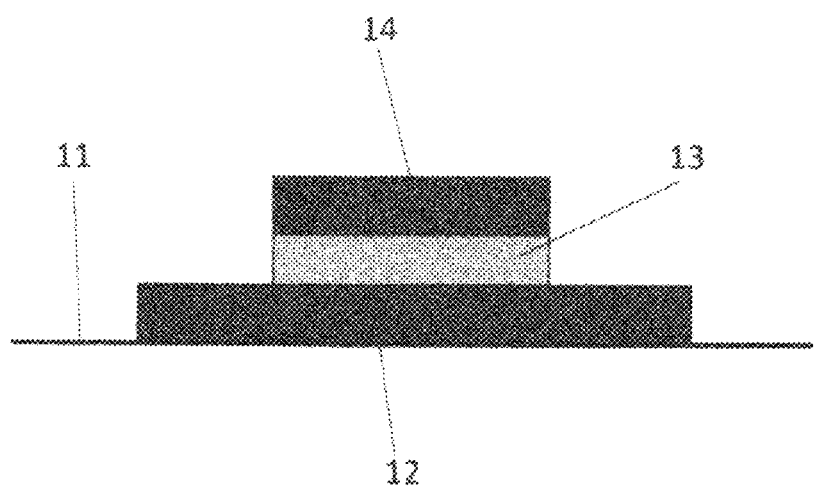
FIG. 2 is a cross-sectional view of a capacitor in an embodiment of the present invention.

As shown in FIG. 2, an example of the capacitor is an electrode 12 consisting of a conductor pattern formed on an insulating resin layer 11 formed directly above or on a glass substrate (not shown), a dielectric layer 13 laminated on the electrode 12, and an electrode 14 of a conductor pattern further thereon. The electrode 12 and the electrode 14 may have a multilayer structure composed of a seed layer that serves as an adhesive layer to a base, and a conductor layer formed thereon with low electrical resistance.

As for the inductor, the same performance as that of a spiral coil can be provided in a substrate having through holes.

Figure 3:
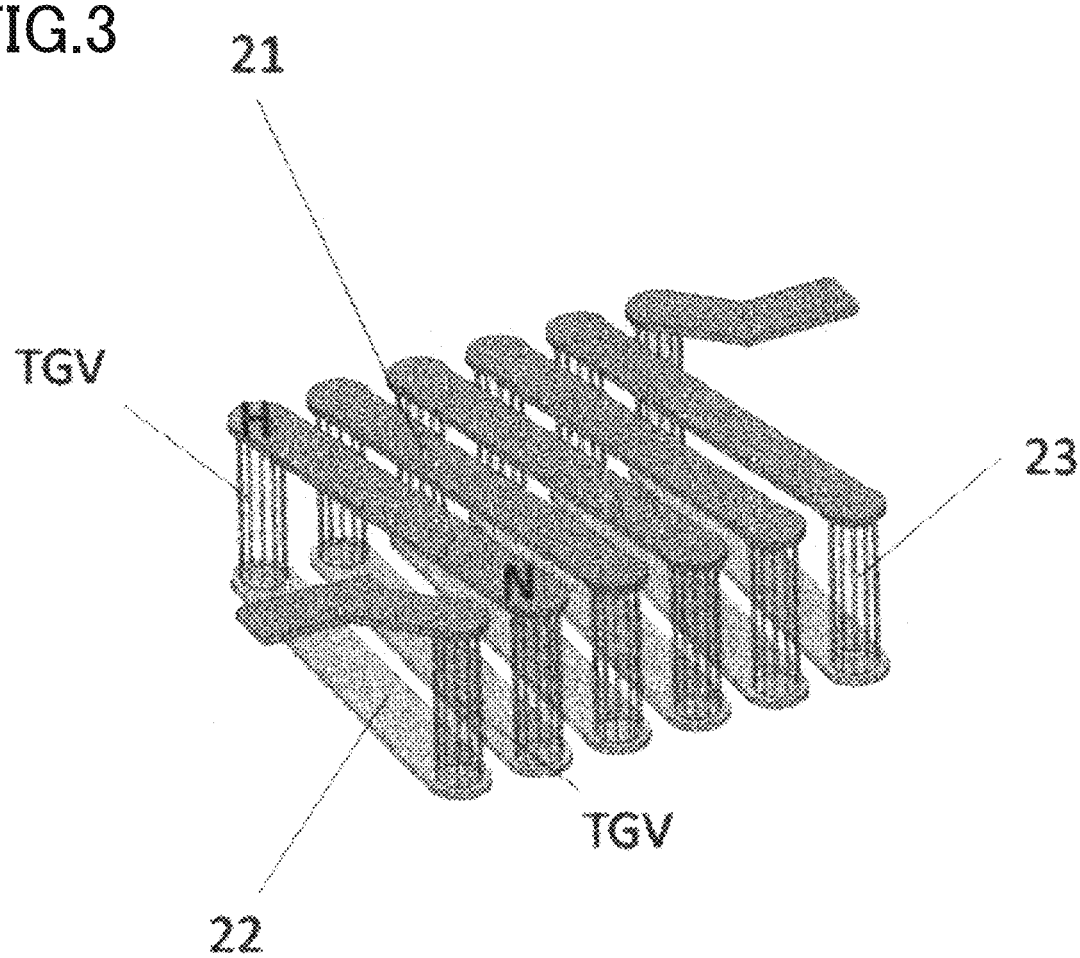
FIG. 3 is a cross-sectional view of an inductor in an embodiment of the present invention.

FIG. 3 illustrates a transparent parallel flat glass plate having through holes 23 arranged in two rows. Wirings 21 and 22 are formed so as to form spiral coils between openings located at opposite positions to openings of through holes 23 formed at equal intervals along two lines extending in parallel on the front and rear surfaces of the glass plate. Furthermore, a conduction layer is formed on the inner walls of the through holes 23 that communicate with the front and rear surfaces of the glass plate to provide TGV (Through Glass Vias), thereby allowing an inductor consisting of a spiral coil to be formed.

Figure 4:
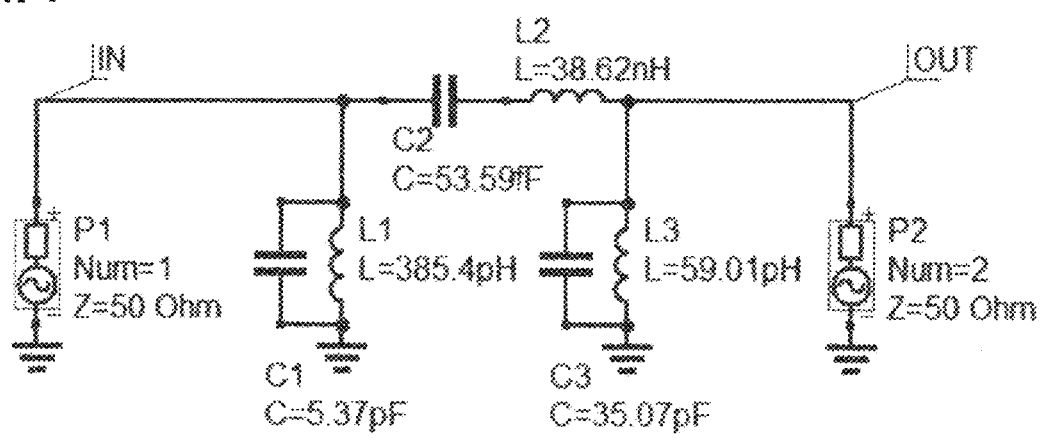
FIG. 4 is a diagram illustrating a circuit diagram of a bandpass filter in an embodiment of the present invention.

Next, a bandpass filter (BPF) including an LC circuit formed inside the substrate will be described. FIG. 4 shows a basic circuit diagram of a BPF. The electrical capacitance (hereinafter, capacitance) of a capacitor and the induction coefficient (hereinafter, inductance) of an inductor in the circuit diagram can be appropriately set to achieve a bandpass effect that passes frequencies in a desired range and blocks others.

Figure 14Y:
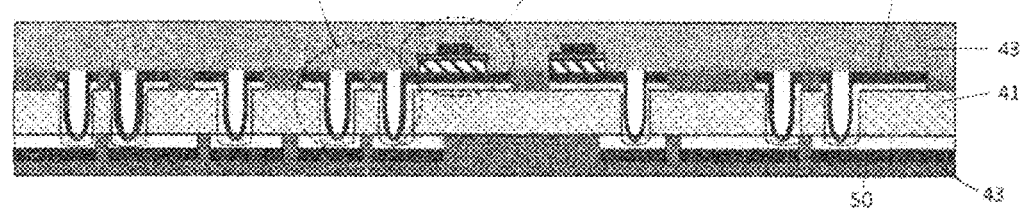
FIG. 14Y is a view illustrating a manufacturing process of a circuit board according to an embodiment of the present invention.

As illustrated in FIG. 14Y, a capacitor CP is embedded in an insulating resin layer 43 disposed on the upper surface of a glass core 41, and in the case of connection to an electrode outside the circuit board, a via hole is formed in the insulating resin layer 43, and can be connected via a conductor formed or filled therein.

In addition, an inductor ID can be formed by the formation of a solenoid coil by connecting the TGV in the glass core 41 and the wiring (see FIG. 3) on the front and rear surfaces of the glass core 41. The main body of the inductor ID are embedded in the glass core 41 and the insulating resin layer 43 on the front and rear surfaces of the glass core 41, and can be electrically connected to an electrode on the outermost layer of the circuit board via a via hole in the insulating resin layer 43 as with the capacitor CP.

The structure described above for the capacitor CP can be employed, for example, for one or more of capacitors C1, C2, and C3. In addition, the structure described above for the inductor ID can be employed, for example, for one or more of inductors L1, L2, and L3. It is to be noted that the inductor L2 (see FIG. 4) is a reactance element for an interference suppression control circuit between bandpass filters.

Next, a circuit board according to an embodiment of the present invention will be specifically described.

Figure 15A:
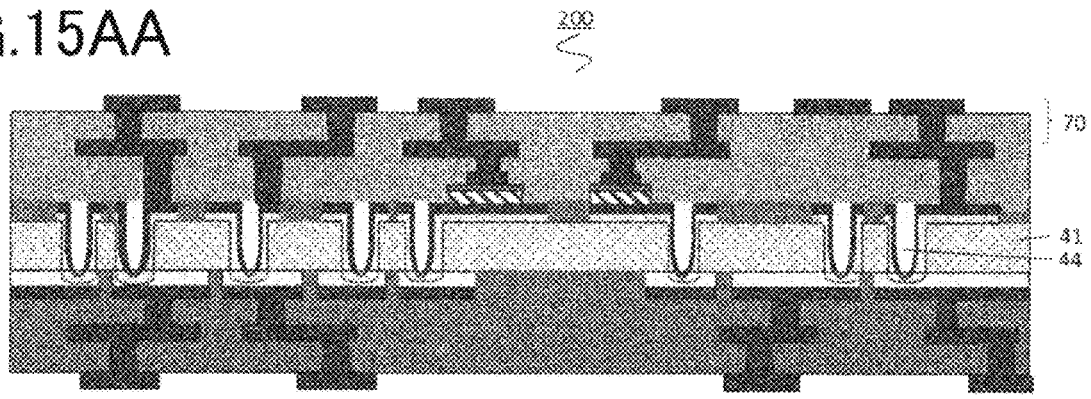
FIG. 15AA is a view illustrating a manufacturing process of a circuit board according to an embodiment of the present invention.

FIG. 15AA is a cross-sectional view schematically illustrating a circuit board 200 according to an embodiment of the present invention.

The circuit board 200 is a circuit board that has an LC circuit built therein with the use of a glass core 41 having through holes 44.

The circuit board 200 includes a basic circuit board 100 with an LC circuit formed thereon (see FIG. 14Z), and a buildup layer 70 formed at the front and rear surfaces of the basic circuit board 100. FIG. 15AA illustrates a case where the buildup layer 70 has one layer (a pair of insulating resin layer and wiring pattern), but two or more buildup layers may be employed.

Figure 14Z:
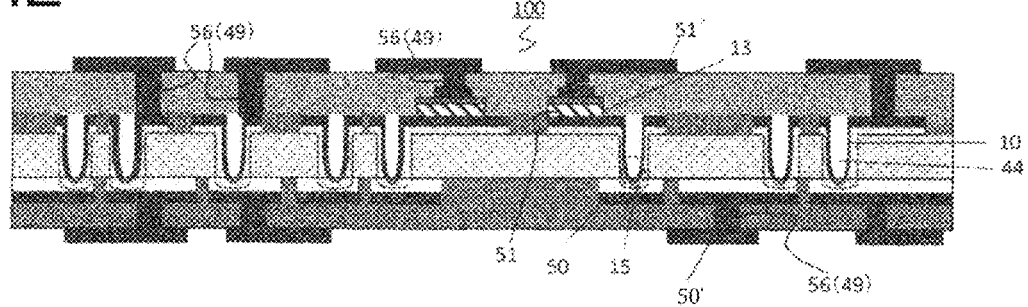
FIG. 14Z is a view illustrating a manufacturing process of a circuit board according to an embodiment of the present invention.

As illustrated in FIG. 14Z, the basic circuit board 100 includes: wiring patterns 50 and 51 formed on the front and rear surfaces of the glass core 41; a conduction layer 10 formed in the through holes 44 of the glass core 41, which connects the wiring patterns 50 and 51 on the front and rear surfaces of the glass core 41; and an LC circuit including a capacitor and an inductor. The capacitor includes a first electrode, a dielectric layer 13 formed thereon, and a second electrode formed on the dielectric layer 13. The first electrode is at least one of the wiring pattern 50 or 51 on the front or rear surface of the glass core 41. The inductor includes a solenoid coil where the wiring pattern 50 formed on one surface of the glass core 41 and the wiring pattern 51 formed on the other surface thereof are sequentially connected in series via the conduction layer 10 formed inside the through holes 44. As described above, the inductor is formed from a coil where the wiring patterns 50 and 51 on the front and rear surfaces of the glass core 41 are connected in series via the conduction layer 10 in the through holes 44, or from parts of the wiring patterns 50 and 51, thereby allowing the thickness of the inductor to be significantly reduced as compared with the case of using an inductor consisting of an individual element.

The conduction layer 10 is connected to the wiring pattern 51 formed on one surface of the glass core 41, and projected from the other surface of the glass core 41, and the projecting member 15 of the conduction layer is connected to the wiring pattern 50 formed on the surface of the glass core 41 on the projecting member 15 side of the conduction layer. The conduction layer 10 is projected from the other surface of the glass core 41, thus increasing the area of the conduction layer 10 in contact with the inner wall surface of the glass core 41. Accordingly, due to the reduction in thickness of the glass core 41 to achieve a low-profile circuit board, the area of the conduction layer 10 in contact with the inner wall surface of the glass core 41 decreases, but the reduction in connection reliability can be suppressed.

A more detailed description will be provided with reference to FIG. 1.

The conduction layer 10 is formed on the inner wall surface of the through hole 44, and connected to the wiring pattern 51 formed on one surface of the glass core 41. The conduction layer 10 herein is made from the same electrolytic copper plating layer as a first adhesive layer 42, and a wiring layer 45 is formed thereon (see FIG. 6F).

In contrast, at the other surface of the glass core 41, the first adhesive layer 42 is projected from the lower surface of the glass core 41, with the conduction layer 10 formed inside the projection as shown in FIG. 1, but actually, the first adhesive layer 42 has a thickness of approximately 0.3 to 0.6 µm, and the conduction layer 10 can be, for example, 5 µm.

Thus, the conduction layer 10 is about ten times as thick as the first adhesive layer 42, and the projected part may be considered as being formed mostly of the conduction layer 10. Then, the conduction layer 10 becomes longer by the protruding length, and the area of contact with the inner wall surface of the glass core 41 is increased accordingly. As a result, the force to resist the stress to deform the layers becomes stronger, thereby improving the interlayer connection reliability.

As shown in FIG. 14Z, the insulating resin layers 43 are formed on the front and rear surfaces of the basic circuit board which includes the wiring patterns 50 and 51, the conduction layer 10, and the LC circuit. Wiring patterns 50' and 51' formed on the insulating resin layers 43 are connected to the wiring patterns 50 and 51 formed on the upper electrode of the capacitor and the glass core 41 via through holes 56 formed in the insulating resin layers 43. It is to be noted that the thorough holes 56 are filled with electrolytic copper plating 49.

Through this process, the basic circuit board 100 where the glass core 41 has a built-in LC circuit composed of an inductor and a capacitor is obtained.

Furthermore, one or more buildup layers are formed on the front and rear surfaces of the basic circuit board 100, thereby allowing the circuit board 200 (see FIG. 15AA) to be obtained.

Figure 16B:
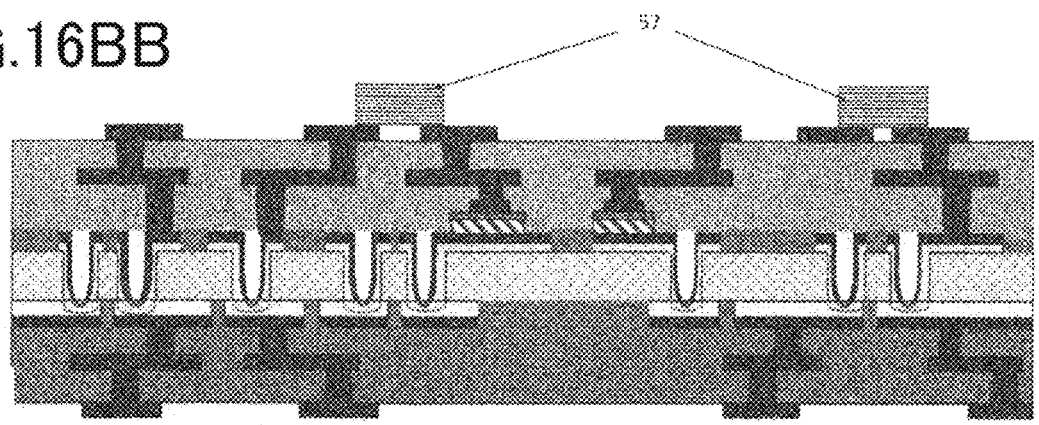
FIG. 16BB is a view illustrating a manufacturing process of a circuit board according to an embodiment of the present invention.

Furthermore, after mounting a high-frequency component 57 on the circuit board 200 as illustrated in FIG. 16BB, a mold resin 58 is molded thereon, thereby allowing a module board 300 (see FIG. 17CC) to be obtained.

In addition, the conduction layer 10 is preferably a laminate of a seed layer that has strong adhesion to the base, and a metal layer that is highly conductive.

In addition, the seed layer is preferably a laminate made of a metal material having strong adhesion with the underlying glass or insulating resin, for example, a thin film selected from Ti, Cr, Ni and Al, and a metal material having a high conductivity, for example, a sputtered thin film of copper or an electroless copper plating thin film. The metal layer is preferably a film of electrolytic copper plating that is capable of forming a film thickness of several micrometers or more in a relatively short period of time.

<Circuit Board Fabrication Process>

With reference to FIG. 5 and the subsequent drawings, an example of a process for fabricating a circuit board with the use of a glass substrate will be described.

(Circuit Design)

First, in order to design a circuit, required capacitance and inductance are calculated using simulation software according to the frequency band to be passed or blocked. Tables 1 and 2 show the specifications of elements for achieving desired characteristics in the circuit configuration shown in FIG. 4 for the bands of 3400 MHz or higher and 3600 MHz or lower, for example. Since the inductors L1 and L3 have very small inductances, it is not necessary to make them into a coil shape (solenoid-type inductor), and the self-inductance of a single wire is sufficient. For this reason, the dimensions of the wire are shown in the table.

TABLE 1

| | C1 | C2 | C3 |
|---|---|---|---|
| Capacitance | 5.37 pF | 53.59 fF | 35.07 pF |
| Dielectric | SiN | SiN | SiN |
| Relative Permittivity | 6.3 | 6.3 | 6.3 |
| Dielectric Thickness | 200 nm | 200 nm | 200 nm |
| Side Length | 138.7 μm | 13.9 μm | 354.5 μm |

TABLE 2

| | L1 | L2 | L3 |
|---|---|---|---|
| Inductance | 385.4 pH | 38.62 nH | 59.01 pH |
| Number of Turns | | 11 | |
| Coil Width | | 1.6 mm | |
| Coil Length | | 1.5 mm | |
| Coil Thickness | | 0.3 mm | |
| Wiring Length | 1.33 mm | | 0.2 mm |
| Wiring Width | 0.1 mm | | 0.1 mm |
| Wiring Thickness | 15 μm | | 15 μm |

The capacitance and inductance of the BPFs for 2499 MHz or higher and 2690 MHz or lower are also calculated to design a required circuit (values are omitted) using the same procedure as that described above.

A circuit board including required circuit elements is fabricated on the basis of the circuit design described above.

Figure 5A:
FIG. 5A is a view illustrating a manufacturing process of a circuit board according to an embodiment of the present invention.

First, as shown in FIG. 5A, a low-expansion glass core 41 (thickness: 300 μm, CTE (Coefficient of Thermal Expansion): 3.5 ppm/K) is prepared.

Figure 5B:
FIG. 5B is a view illustrating a manufacturing process of a circuit board according to an embodiment of the present invention.

Then, as shown in FIG. 5B, through holes 44 having an opening diameter of 80 μm to 100 μm are formed in the glass core 41. In the first step for the formation of the through holes 44, desired positions are pulse-irradiated with a UV laser beam to form weakened portions in the glass. In the second step, the entire glass plate is etched by using a hydrogen fluoride aqueous solution (hydrofluoric acid). Thus, the weakened portions are selectively etched, and the through holes 44 is quickly formed. In comparison with a case where a glass epoxy substrate is used, the through holes 44 with more accurate inner diameters and inner wall surfaces without unevenness can be formed.

Figure 5C:
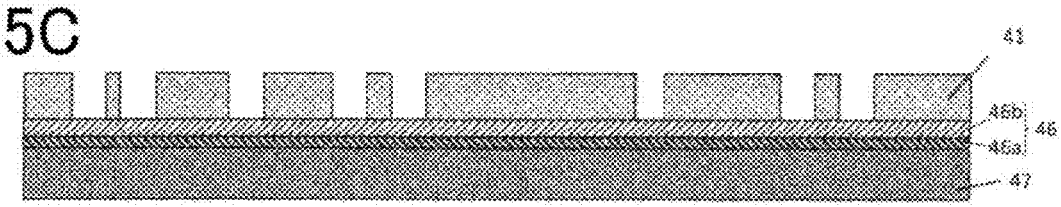
FIG. 5C is a view illustrating a manufacturing process of a circuit board according to an embodiment of the present invention.

Next, as shown in FIG. 5C, a support body 47 with an adhesive layer 46 is bonded to the glass core 41. The support body 47 is a substrate made of a material, for example, having light transmissive properties (transparency). The support body 47 may transmit light with a wavelength, for example, in a range of 300 nm or more and 2000 nm or less, or in a range of 300 nm or more and 1100 nm or less. The support body 47 may have properties that transmit light with a specific wavelength, for example, a laser beam.

The support body 47 is formed of, for example, a glass substrate. Examples of the glass include a quartz glass, borosilicate glass, non-alkali glass, soda glass, and sapphire glass. When the surface roughness Rz (also referred to as a maximum height) of the main surface 47a (the surface in contact with adhesive layer 46) of the support body 47 is 0.01 μm or more, the increase in cost for preparing the support body 47 can be suppressed. In addition, when the surface roughness Rz of the main surface 47a of the support body 47 is 5 μm or less, disconnection and short circuiting of the wiring layer 45 (see FIG. 6F) due to unevenness of the main surface 47a can be reduced.

The adhesive layer 46 includes a peeling layer 46a and a protective layer 46b and serves as a layer for bonding the support body 47 and the glass core 41 to each other.

The peeling layer 46a is provided on the main surface 47a of the support body 47 and includes a resin that can be decomposed by light irradiation. For example, a laser beam is used as the light, and a resin that can be thermally decomposed by being irradiated with the laser beam is used as the resin included in the peeling layer 46a. Examples of the resin in the peeling layer 46a include one of an epoxy resin, polyurethane resin, silicone resin, polyester resin, oxetane resin, maleimide resin, or a mixture of two or more these resins.

The protective layer 46b is formed on the peeling layer 46a, and the protective layer 46b serves to prevent damage to the substrate due to heat generated when the glass is peeled by the laser beam. Examples of the material thereof include one of an epoxy resin, a polyurethane resin, a silicone resin, a polyester resin, an oxetane resin, and a maleimide resin, or a mixture of two or more of these resins, and the layer contains a component that is cured by light.

The adhesive layer 46 preferably has a thickness of, for example, 20 μm or more and 100 μm or less.

Figure 5D:
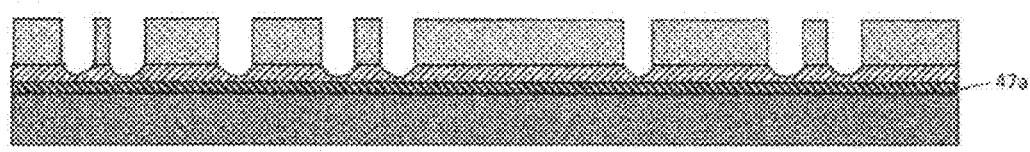
FIG. 5D is a view illustrating a manufacturing process of a circuit board according to an embodiment of the present invention.

Next, as shown in FIG. 5D, the adhesive layer 46 exposed at the bottoms of the through holes 23 are etched. For example, in the case of etching by RIE (Reactive Ion Etching), the adhesive layer 46 is etched at about 1.6 Pa (the degree of vacuum: 120 mm Torr) and power of 80 W with the use of a mixed gas of $CF_4$ and $O_2$ so as to be, for example, 1 μm or more in depth from the bottom surface of the glass, thereby removing 1 μm or more of the protective layer 46b of the adhesive layer 46.

Figure 6E:
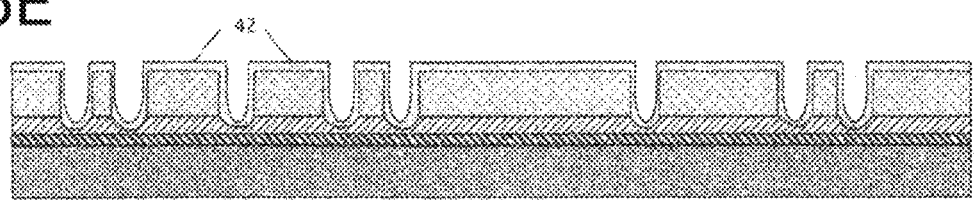
FIG. 6E is a view illustrating a manufacturing process of a circuit board according to an embodiment of the present invention.

Next, as shown in FIG. 6E, as the first adhesive layer 42 under the wiring layer 45 (see FIG. 6F) and on the inner walls of the through holes 44 in the glass core 41, for example, a Ti film and a Cu film are formed in two layers on the entire surface of the glass core 41 in this order by sputtering, and the glass surface and the surface of the adhesive layer 46 at the bottoms of the through holes 44 have electrical conductivity. The film thicknesses may be set such that the electrical conductivity of the surfaces such as the glass surface enables electrolytic plating, and for example, the thickness of the Ti film may be set to 50 nm, and the thickness of the Cu film may be set to 300 nm.

Figure 6F:
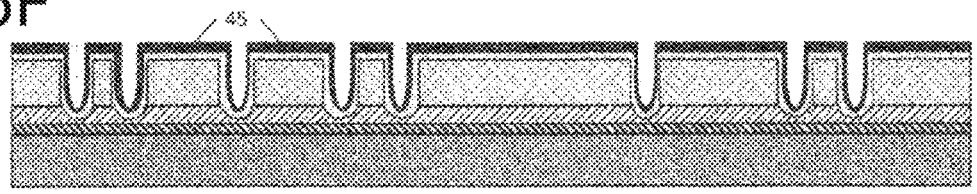
FIG. 6F is a view illustrating a manufacturing process of a circuit board according to an embodiment of the present invention.

Next, as shown in FIG. 6F, the wiring layer 45 is formed by electrolytic copper plating. There is no need to particularly limit the thickness of the copper plating, but the thickness can be, for example, several micrometers to several tens of micrometers.

Figure 6G:
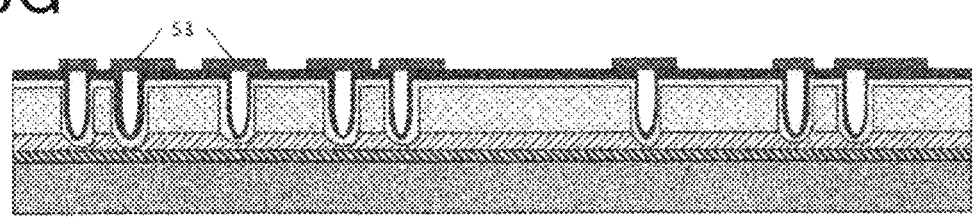
FIG. 6G is a view illustrating a manufacturing process of a circuit board according to an embodiment of the present invention.

Next, as shown in FIG. 6G, a dry film resist layer 53 for forming a wiring pattern 51 is formed on the wiring layer 45.

Figure 7H:
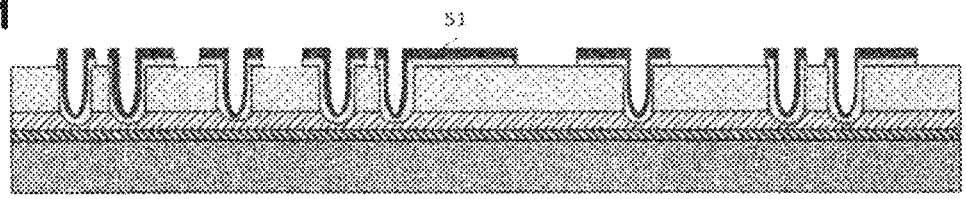
FIG. 7H is a view illustrating a manufacturing process of a circuit board according to an embodiment of the present invention.

Next, as shown in FIG. 7H, a part of the wiring layer 45 made of the electrolytic copper plating, which is not coated with the dry film resist layer 53, is removed by etching with the use of an etching liquid for copper.

In this stage, as shown in FIG. 7H, the front and rear surfaces of the glass core 41 have a mixture of: a part where the glass surface is exposed; and the wiring pattern 51 where the electrolytic copper plating is laminated on the first adhesive layer 42. In the step of FIG. 7H, a lower electrode (not shown) of a capacitor is formed at a predetermined position of the wiring pattern 51.

Figure 7I:
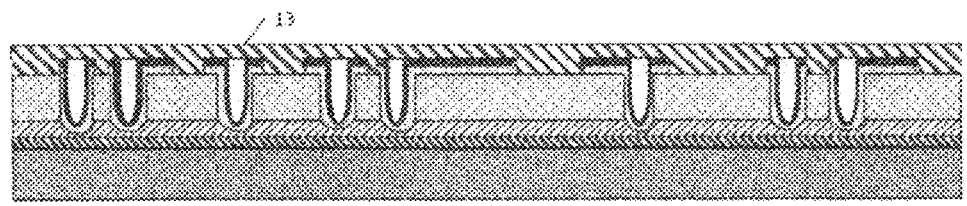
FIG. 7I is a view illustrating a manufacturing process of a circuit board according to an embodiment of the present invention.

Next, as shown in FIG. 7I, first, over the entire surface of the glass core 41 where a capacitor is to be formed, a SiN film of, for example, 200 nm to 400 nm in thickness is formed by a CVD (Chemical Vapour Deposition) film formation method to form a dielectric layer 13 of a capacitor.

Figure 7J:
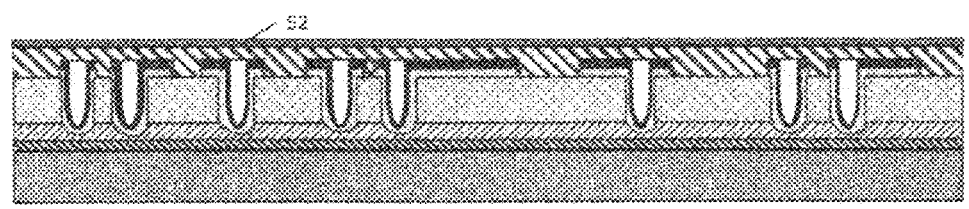
FIG. 7J is a view illustrating a manufacturing process of a circuit board according to an embodiment of the present invention.

Further, as shown in FIG. 7J, as a seed layer 52 for forming the upper electrode of the capacitor, a Ti film and a Cu film are formed on the entire surface of the dielectric layer 13 in this order, for example, at a thickness of 50 nm and 300 nm, respectively, by sputtering.

Figure 8K:
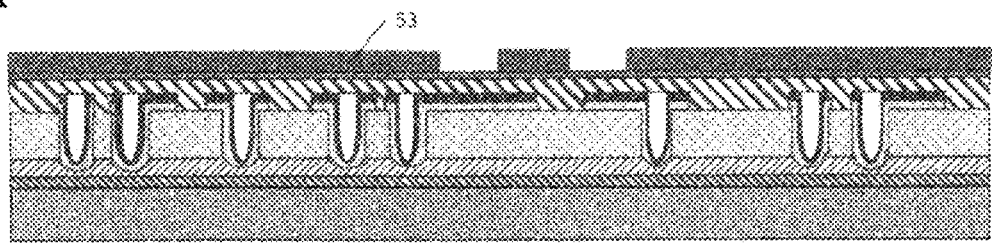
FIG. 8K is a view illustrating a manufacturing process of a circuit board according to an embodiment of the present invention.

Subsequently, as shown in FIG. 8K, only a portion where the upper electrode is to be formed is exposed from the dry film resist layer 53 by photolithography to thereby form an upper electrode of the capacitor.

Figure 8L:
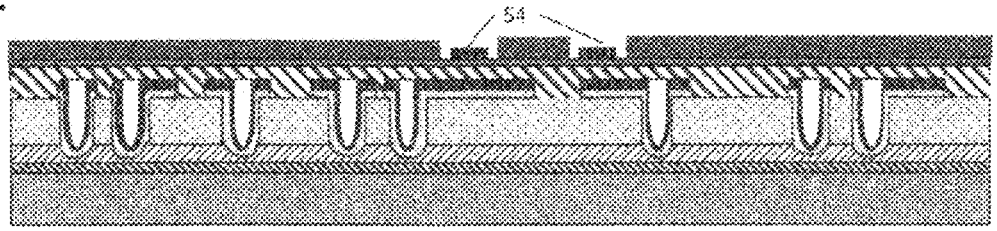
FIG. 8L is a view illustrating a manufacturing process of a circuit board according to an embodiment of the present invention.

Then, as shown in FIG. 8L, electrolytic copper plating is applied to form an upper electrode 54 with a thickness of 9 to 10 μm.

Figure 9M:
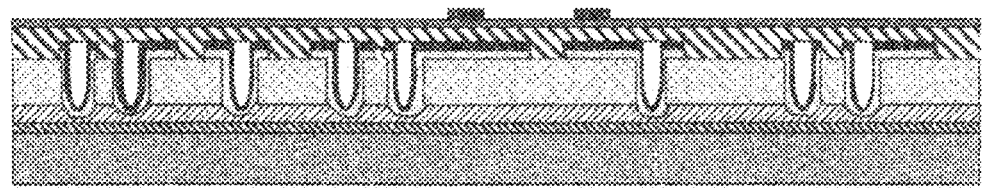
FIG. 9M is a view illustrating a manufacturing process of a circuit board according to an embodiment of the present invention.

Thereafter, as shown in FIG. 9M, the dry film resist layer 53 is removed. Here, a SiN layer and the like are laminated in addition to the capacitor.

Figure 9N:
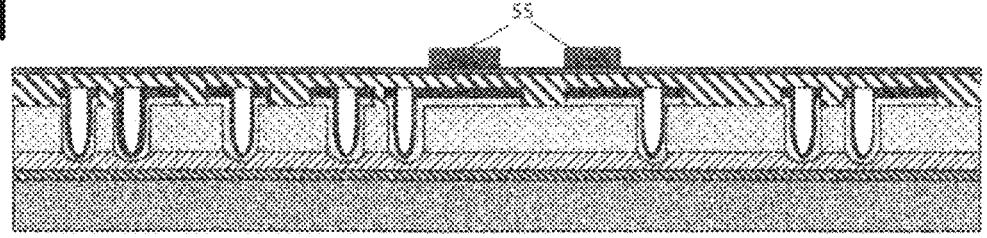
FIG. 9N is a view illustrating a manufacturing process of a circuit board according to an embodiment of the present invention.

Next, as shown in FIG. 9N, only the upper electrode 54 of the capacitor is firstly protected with a dry film resist 55 by photolithography in order to remove the excess first adhesive layer 42 and a plating seed layer.

Figure 10O:
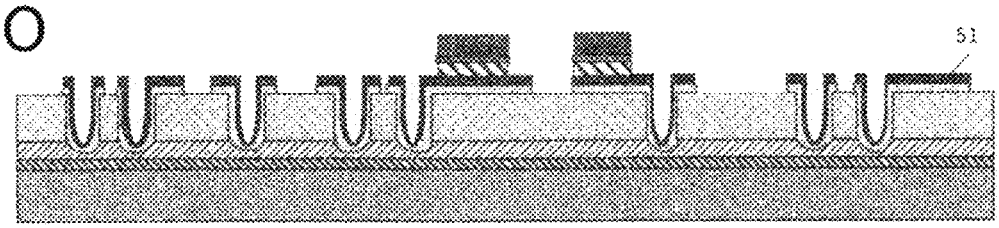
FIG. 10O is a view illustrating a manufacturing process of a circuit board according to an embodiment of the present invention.

Then, as shown in FIG. 10O, the substrate is processed by wet etching to remove excess portions of the sputtered copper layer in film formation of the upper electrode 54 of the capacitor, and the substrate is processed by dry etching to remove the Ti layer and SiN layer of the excess portions.

Specifically, the uppermost sputtered Cu layer of the excess portion is removed with an etching solution. Then, the underlying sputtered Ti layer and the SiN layer formed by CVD are removed by dry etching.

Figure 10P:
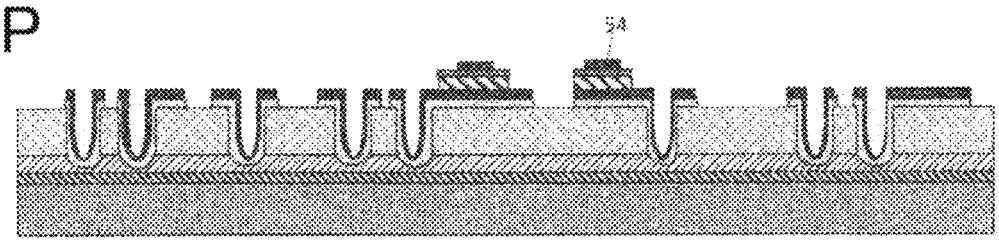
FIG. 10P is a view illustrating a manufacturing process of a circuit board according to an embodiment of the present invention.

Subsequently, as shown in FIG. 10P, the dry film resist 55 protecting the upper electrode 54 of the capacitor is stripped and removed.

Figure 11Q:
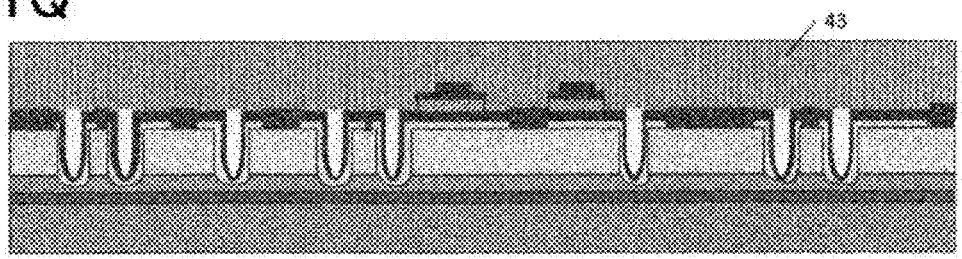
FIG. 11Q is a view illustrating a manufacturing process of a circuit board according to an embodiment of the present invention.

Next, as shown in FIG. 11Q, an insulating resin, for example, manufactured by Ajinomoto Fine-Techno Co., Inc. (product name "ABF GX-T31R") is attached to the upper surface of the glass core 41 to form an insulating resin layer 43. The processing is performed by using a vacuum laminating press machine, thereby laminating the insulating resin without forming voids in the through holes 44 of the glass core 41. The thickness of the insulating resin layer 43 is set to, for example, approximately 35 μm such that the upper electrode 54 of the capacitor is completely embedded therein.

Figure 11R:
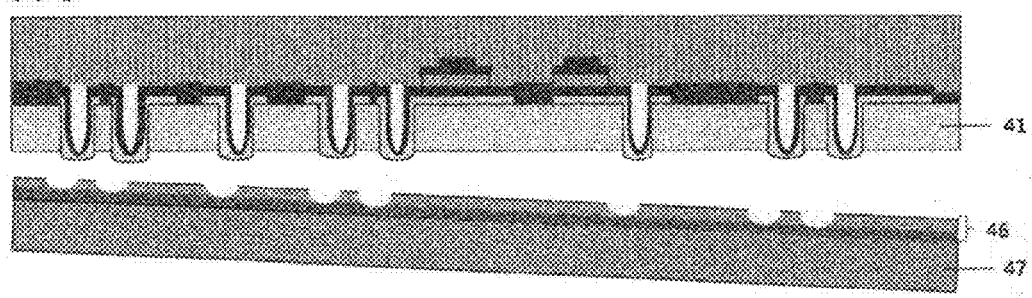
FIG. 11R is a view illustrating a manufacturing process of a circuit board according to an embodiment of the present invention.

Next, as shown in FIG. 11R, the support body 47 is stripped from the glass core 41. For the peeling, the adhesive layer 46 is irradiated with a laser beam through the support body 47. The irradiation with the laser beam may be performed over the entire surface of the support body 47, or at a desired position of the support body 47.

In this step, the entire support body 47 is irradiated with the laser beam in a linearly reciprocating manner from the viewpoint of ensuring the decomposition of the resin in the adhesive layer 46 for making the resin peelable. The laser beam may have a wavelength, for example, in a range of 300 nm or more and 2000 nm or less, 300 nm or more and 1500 nm or less, or 300 nm or more and 1100 nm or less. As an example of the device that emits the laser beam, devices can be used, such as a YAG laser that emits a wavelength of 1064 nm, a second harmonic YAG laser that emits a wavelength of 532 nm, or a semiconductor laser that emits a wavelength of 780 nm or more and 1300 nm or less. The support body 47 has transparency, and transmits the laser beam. Accordingly, the energy of the laser beam transmitted through the support body 47 is absorbed by the adhesive layer 46. The absorbed energy of the laser beam is converted into thermal energy in the adhesive layer 46. This thermal energy causes the resin of the adhesive layer 46 to reach a thermal decomposition temperature, thereby thermally decomposing the resin. Accordingly, the force of the adhesive layer 46 for bonding the support body 47 and the glass core 41 is weakened and the resin becomes peelable.

Figure 12S:
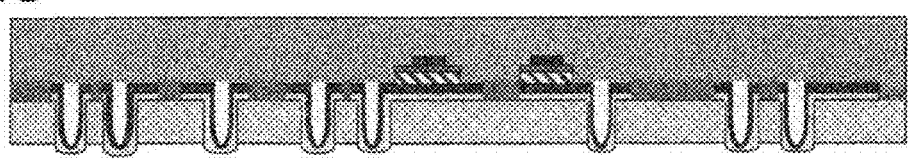
FIG. 12S is a view illustrating a manufacturing process of a circuit board according to an embodiment of the present invention.

FIG. 12S shows the substrate with the support body 47 and adhesive layer 46 peeled therefrom.

Figure 12T:
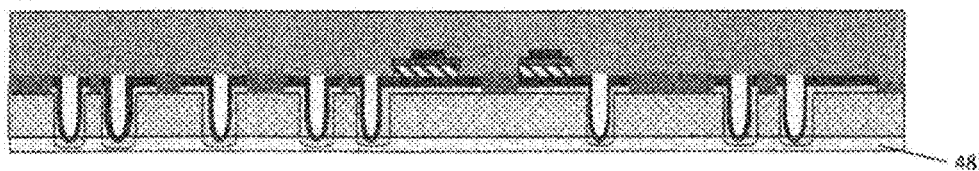
FIG. 12T is a view illustrating a manufacturing process of a circuit board according to an embodiment of the present invention.

Next, as shown in FIG. 12T, a Ti film and a Cu film are formed as the second adhesion layer 48 on the bottom surface of the glass core 41 and the projections of the through holes 44, and the entire bottom surface of the glass core 41 is formed in two layers in this order by sputtering, and the bottom surface of the glass is electrically conductive. As for the film thicknesses, for example, that of the Ti film may be set to 50 nm, and the Cu film may be set to 300 nm.

Figure 12U:
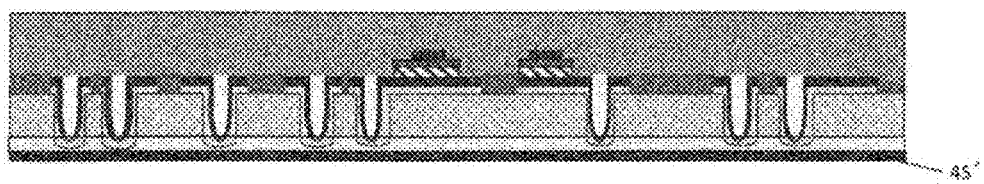
FIG. 12U is a view illustrating a manufacturing process of a circuit board according to an embodiment of the present invention.

Next, as shown in FIG. 12U, a wiring layer 45' is formed on the second adhesive layer 48 by electrolytic copper plating.

Figure 13V:
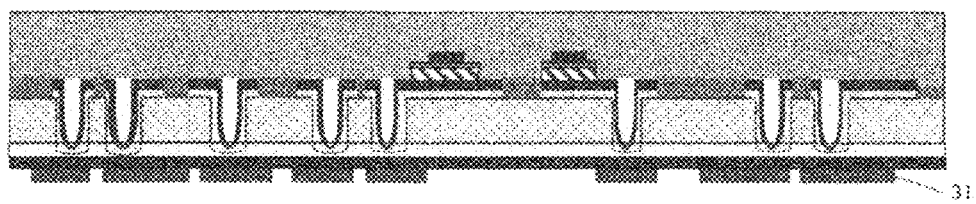
FIG. 13V is a view illustrating a manufacturing process of a circuit board according to an embodiment of the present invention.

Next, as shown in FIG. 13V, a resist pattern 31 is formed on the wiring layer 45'.

Figure 13W:
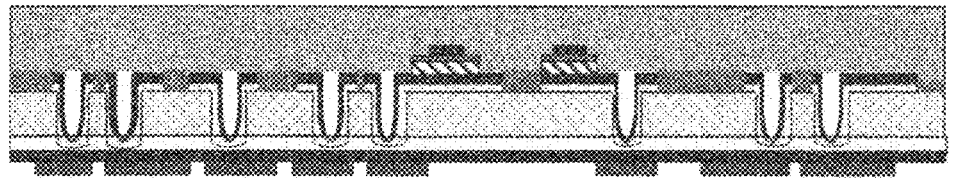
FIG. 13W is a view illustrating a manufacturing process of a circuit board according to an embodiment of the present invention.

Next, as shown in FIG. 13W, the resist pattern 31 is used as an etching mask to remove the wiring layer 45' by etching. Since the wiring layer 45' is an electrolytic copper plating layer, and then etched with the use of an etching liquid for copper, the second adhesive layer (sputtered copper layer and sputtered Ti layer) 48 located at a base under the wiring layer 45' is further removed respectively by wet etching with a copper etching solution and dry etching, thereby forming a wiring pattern 50.

Figure 13X:
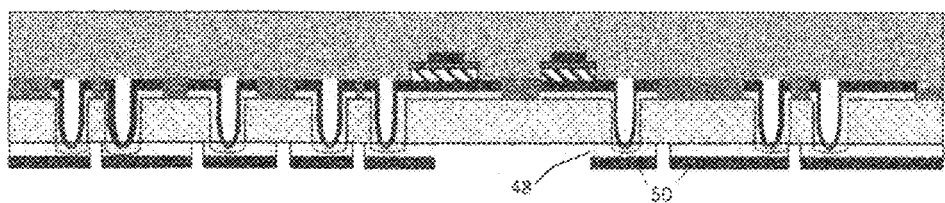
FIG. 13X is a view illustrating a manufacturing process of a circuit board according to an embodiment of the present invention.

Next, as shown in FIG. 13X, the resist pattern 31 is stripped. In this way, the wiring pattern 50 that is a laminated pattern of the second adhesive layer 48 and the wiring layer 45', is formed on the glass core 41.

Next, as shown in FIG. 14Y, an insulating resin, for example, manufactured by Ajinomoto Fine-Techno Co., Inc. (product name "ABF GX-T31R") is attached to the bottom surface of the glass core 41 with the wiring pattern 50 formed thereon to form an insulating resin layer (resin build layer) 43. The processing is performed by using a vacuum laminating press machine, thereby laminating the insulating resin without forming voids in the wiring pattern 50. The thickness of the insulating resin layer 43 is set to, for example, approximately 35 μm such that the wiring pattern 50 is completely embedded therein.

Next, as shown in FIG. 14Z, the through holes 56 reaching the wiring patterns 50 and 51 of the glass core are formed by laser processing at positions of the insulating resin layer 43 where electric conduction is desired. The through holes 56 are preferably approximately 60 μm in diameter.

Although not shown, the insulating resin layer 43 of the front and rear surfaces of the glass core 41 is processed with an alkaline-based surface roughening solution to adjust the arithmetic surface roughness Ra to, for example, 60 nm. This is to increase the adhesion of the seed layer in the next step.

Next, although not shown, the insulating resin layer 43 on the front and rear surfaces is subjected to electroless copper plating to form a conductive seed layer. The thickness thereof may be, for example, 0.6 μm. With this processing, the conductive seed layer is formed not only on the front and rear surfaces but also on the inner wall surfaces of the through holes 56 which are previously formed by the laser processing.

Next, although not shown, a dry film resist is attached to both surfaces of the substrate, and an opening is formed by photolithography at a position where a wiring pattern 51' is to be provided. Then, the substrate is subjected to electrolytic copper plating to form the wiring pattern 51' of, for example, 15 μm in thickness. Further, in the electrolytic copper plating, the through holes 56 in the insulating resin layer 43 are filled with electrolytic copper plating 49, and can be also electrically connected to the wiring patterns 50 and 51 on the surfaces of the glass core 41.

Thereafter, the basic circuit board 100 including built-in elements for an LC circuit as shown in FIG. 14Z is completed by removing the unnecessary conductive seed layer by etching.

For the basic circuit board 100, a reactance element (coil) having a flat shape (for example, spiral shape) can be formed on the surface of the glass core 41 or the insulating resin layer 43. Further, an electrically neutral through hole can be formed between reactance elements to reduce losses due to mutual induction, and capacitance can further be provided in the through hole.

Further, when the insulating layer 43 and the wiring patterns 50 and 51 made of copper is laminated on the glass core 41, a silicon nitride layer or the like can be provided, for example, directly on the glass core 41 in order to prevent occurrence of warpage or cracking of the glass core 41 due to stress imbalance. The silicon nitride layer has a function of cancelling the residual stress from the copper wiring patterns 50 and 51. Thus, a built-up wiring layer in which the stress is adjusted can be provided by this combination. However, it should be noted that the silicon nitride is merely an example, and is not limited thereto.

As shown in FIG. 15AA, one buildup layer 70 is formed on each of the front and rear surface of the basic circuit board 100, thereby allowing the circuit board 200 to be obtained. FIG. 15AA shows an example in which one buildup layer 70 is formed.

Figure 17C:
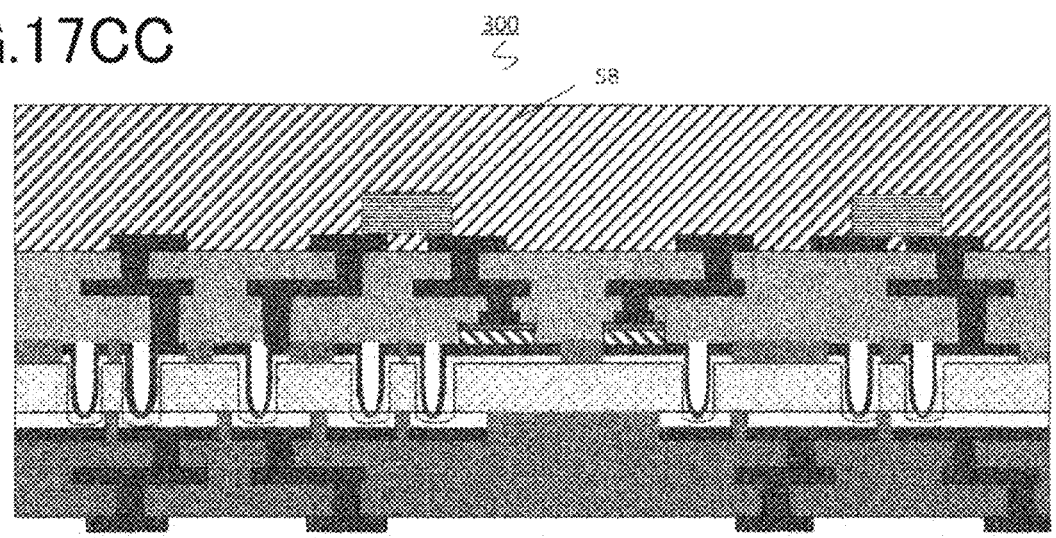
FIG. 17CC is a view illustrating a manufacturing process of a circuit board according to an embodiment of the present invention.

Further, as shown in FIG. 17CC, a module substrate 300 can be provided by mounting high-frequency components 57 on the circuit board 200 shown in FIG. 16BB, and molding a mold resin 58 thereon. Such a module substrate 300 has a conductive member at the surface opposite to the surface with the high-frequency components 57 mounted thereon, which can be connected to a mother substrate (not shown). This connection allows heat generated from the high-frequency components 57 to be transferred to the mother substrate, thereby allowing a larger heat dissipation area to be obtained.

Reference Signs List

10 . . . Conduction layer (in through hole); 11 . . . Insulating resin layer; 12 . . . Lower electrode (of capacitor); 13 . . . Dielectric layer (of capacitor); 14 . . . Upper electrode (of capacitor); 15 . . . Projecting member (of conduction layer); 21 . . . Wiring; 22 . . . Wiring; 23 . . . Through hole; 30 . . . Wiring pattern; 31 . . . Resist pattern; 41 . . . Glass core; 42 . . . First adhesive layer (Ti/Cu sputtered layer); 42a Ni plating; 43 . . . Insulating resin layer; 44 . . . Through hole; 45 . . . Wiring layer; 45' . . . Wiring layer; 46 . . . Adhesive layer; 46a . . . Peeling layer; 46b Protective layer; 47 . . . Support body; 47a . . . Support body surface; 48 . . . Second adhesive layer (Ti/Cu sputtered layer); 49 . . . Electrolytic copper plating; 50 . . . Wiring pattern; 50' . . . Wiring pattern; 51 . . . Wiring pattern; 51' . . . Wiring pattern; 52 . . . Seed layer; 53 . . . Dry film resist layer; 54 . . . Upper electrode (of capacitor); 55 . . . Dry film resist layer (for capacitor protection); 56 . . . Through hole; 57 . . . High-frequency component; 58 . . . mold resin; 65 . . . Wiring; 70 . . . Buildup layer; 100 . . . Basic circuit board; 200 . . . Circuit board; 300 . . . Module substrate; CP . . . Capacitor; ID . . . Inductor.

What is claimed is:

1. A circuit board comprising:
a glass core provided with a first main surface and a second main surface, the glass core provided with one or more through holes each extending from the first main surface to the second main surface;
a conduction layer which includes one or more first parts coating each side wall of the one or more through holes, and one or more second parts each projected from the second main surface at positions of the one or more through holes;
a first wiring pattern provided on the first main surface and electrically connected to the conduction layer; and
a second wiring pattern provided on the second main surface, the second wiring pattern coating the one or more second parts,
wherein the one or more second parts have a tapered shape.

2. The circuit board of claim 1, wherein the glass core has a thickness in a range of 50 to 1000 μm.

3. The circuit board of claim 1, wherein the one or more second parts are projected from the second main surface at a height in a range of 1 to 10 μm from the second main surface.

4. The circuit board of claim 1, further comprising:
a dielectric layer provided on the first wiring pattern; and
an electrode provided on the dielectric layer,
wherein the electrode, the dielectric layer, and a part of the first wiring pattern facing the electrode with the dielectric layer interposed therebetween constitute a capacitor.

5. The circuit board of claim 1, wherein at least a part of the first wiring pattern, at least a part of the conduction layer, and at least a part of the second wiring pattern constitute a solenoid coil having a screw axis in a direction intersecting a thickness direction of the glass core.

6. The circuit board of claim 1, further comprising:
one or more first buildup layers provided over the first main surface with the first wiring pattern interposed therebetween, the one or more first buildup layers each including a first insulating resin layer and a third wiring pattern provided on the first insulating resin layer; and
one or more second buildup layers provided over the second main surface with the second wiring pattern interposed therebetween, the one or more second buildup layers each including a second insulating resin layer and the third wiring pattern provided on the second insulating resin layer.

7. A circuit board comprising:
a glass core provided with a first main surface and a second main surface, the glass core provided with one or more through holes each extending from the first main surface to the second main surface;
a conduction layer which includes one or more first parts coating each side wall of the one or more through holes, and one or more second parts each projected from the second main surface at positions of the one or more through holes;
a first wiring pattern provided on the first main surface and electrically connected to the conduction layer; and
a second wiring pattern provided on the second main surface, the second wiring pattern coating the one or more second parts,
wherein the one or more second parts are projected from the second main surface at a height in a range of 1 to 10 μm from the second main surface.

8. The circuit board of claim 7, wherein the glass core has a thickness in a range of 50 to 1000 μm.

9. The circuit board of claim 7, further comprising:
a dielectric layer provided on the first wiring pattern; and
an electrode provided on the dielectric layer,
wherein the electrode, the dielectric layer, and a part of the first wiring pattern facing the electrode with the dielectric layer interposed therebetween constitute a capacitor.

10. The circuit board of claim 7, wherein at least a part of the first wiring pattern, at least a part of the conduction layer, and at least a part of the second wiring pattern constitute a solenoid coil having a screw axis in a direction intersecting a thickness direction of the glass core.

11. The circuit board of claim 7, further comprising:
one or more first buildup layers provided over the first main surface with the first wiring pattern interposed therebetween, the one or more first buildup layers each including a first insulating resin layer and a third wiring pattern provided on the first insulating resin layer; and
one or more second buildup layers provided over the second main surface with the second wiring pattern interposed therebetween, the one or more second buildup layers each including a second insulating resin layer and the third wiring pattern provided on the second insulating resin layer.

* * * * *